United States Patent [19]

Krikorian et al.

[11] 4,057,476
[45] Nov. 8, 1977

[54] THIN FILM PHOTOVOLTAIC DIODES AND METHOD FOR MAKING SAME

[75] Inventors: Esther Krikorian, Claremont; Michael J. Crisp, Placentia, both of Calif.

[73] Assignee: General Dynamics Corporation, Pomona, Calif.

[21] Appl. No.: 690,344

[22] Filed: May 26, 1976

[51] Int. Cl.² .................. C23C 15/00; H01L 31/00
[52] U.S. Cl. .............................. 204/192 P; 250/211 J; 357/11; 357/15; 357/30; 148/174; 148/175; 204/192 S
[58] Field of Search .......... 204/192 P, 192 S, 192 SP; 357/11, 30, 15, 63; 136/89, 89 C, 89 ST; 250/211 J

[56] References Cited

U.S. PATENT DOCUMENTS

| 3,961,998 | 6/1976 | Scharnhorst et al. | 148/175 |
| 3,979,271 | 9/1976 | Noreika et al. | 204/192 S |
| 4,013,533 | 3/1977 | Cohen-Solal et al. | 204/192 S |

OTHER PUBLICATIONS

C. A. Kennedy et al., "High Performance 8-14 um Pb$_{1-x}$Sn$_x$Te Photodiodes", Proc. IEEE, vol. 63, pp. 27-31 (1975).
K. W. Nill et al, "Laser Emission From Metal-Semiconductor Barriers on PbTe and Pb$_{0.8}$Sn$_{0.2}$Te", Appl. Phys. Lett., vol. 16, pp. 375-377 (1970).
W. Rolls et al., "Preparation and Properties of Lead--Tin-Telluride Photodiodes", Solid State Electronics, vol. 13, pp. 75-81 (1970).
I. Melngailis et al., "Photovoltaic Effect in Pb$_x$Sn$_{1-x}$Te Diodes", Appl. Physics Lett., vol. 9, pp. 304-305 (1966).
E. Krikorian, "Thin Films For Electrooptic Devices", J. Vac. Sci. Tech., vol. 12, pp. 186-187, Jan./Feb. 1975.
C. Corsi, "Pb$_x$Sn$_{1-x}$Te Layers by RF Multicathode Sputtering", J. Appl. Phys., vol. 45, pp. 3467-3471 (1974).
C. Corsi et al., "Pb$_x$Sn$_{1-x}$Te Epitaxial Layers by RF Multicathode Sputtering", Appl. Phys. Lett., vol. 24, pp. 484-485 (1974).

C. Corsi et al., "Infrared Detector Arrays by RF Sputtering", Infrared Physics, vol. 12, pp. 271-275 (1972).
C. Corsi et al., "Thin Film Infrared Detector Arrays For Integrated Electronic Structures", Infrared Physics, vol. 16, pp. 37-45 (1976).

*Primary Examiner*—John H. Mack
*Assistant Examiner*—Aaron Weisstuch
*Attorney, Agent, or Firm*—Henry M. Bissell; Edward B. Johnson

[57] ABSTRACT

Photovoltaic diodes prepared by the methods of the invention include p-n (or n-p) heterojunction or homojunction diodes as well as Schottky barrier diodes where both elements of the diode comprise thin monocrystalline films of Pb$_{1-x}$Sn$_x$Te or a thin monocrystalline film of Pb$_{1-x}$Sn$_x$Te and an appropriate thin barrier metal film. Such a monocrystalline Pb$_{1-x}$Sn$_x$Te film is sputter deposited, has a composition Pb$_{1-x}$Sn$_x$Te which may range from $x = 0.0$ to about $x = 0.3$ and, consequently, can be preselected to have a photovoltaic response with response cutoff wavelengths ranging from about 6.0μm to about 25μm at 77° K. The first film is sputter deposited under controlled conditions in accordance with the present method, including at low pressure of selected gas and at selected substrate temperature and film growth rate conditions with or without substrate temperature and film growth rate condition with or without substrate bias voltage of from about +30 volts to about −30 volts, so as to control the composition and stoichiometry of the resulting film as well as its carrier type, carrier concentration and Hall mobility to provide selected electro-optical properties. Thereupon a second film is deposited, which is either a film of composition Pb$_{1-x_1}$Sn$_{x_1}$Te where $x_1$ may range from 0.0 to about 0.3, in which case this film is deposited directly upon the first film, or a film of thin barrier metal which may be deposited on the first film. The thin barrier metal film is utilized in preparing Schottky type diodes and the film may be lead, indium or the like. The present method provides in a very economical manner at moderate conditions high sensitivity photovoltaic diodes utilizing PbSnTe films requiring no costly and time consuming post-deposition treatment such as annealing.

24 Claims, 15 Drawing Figures

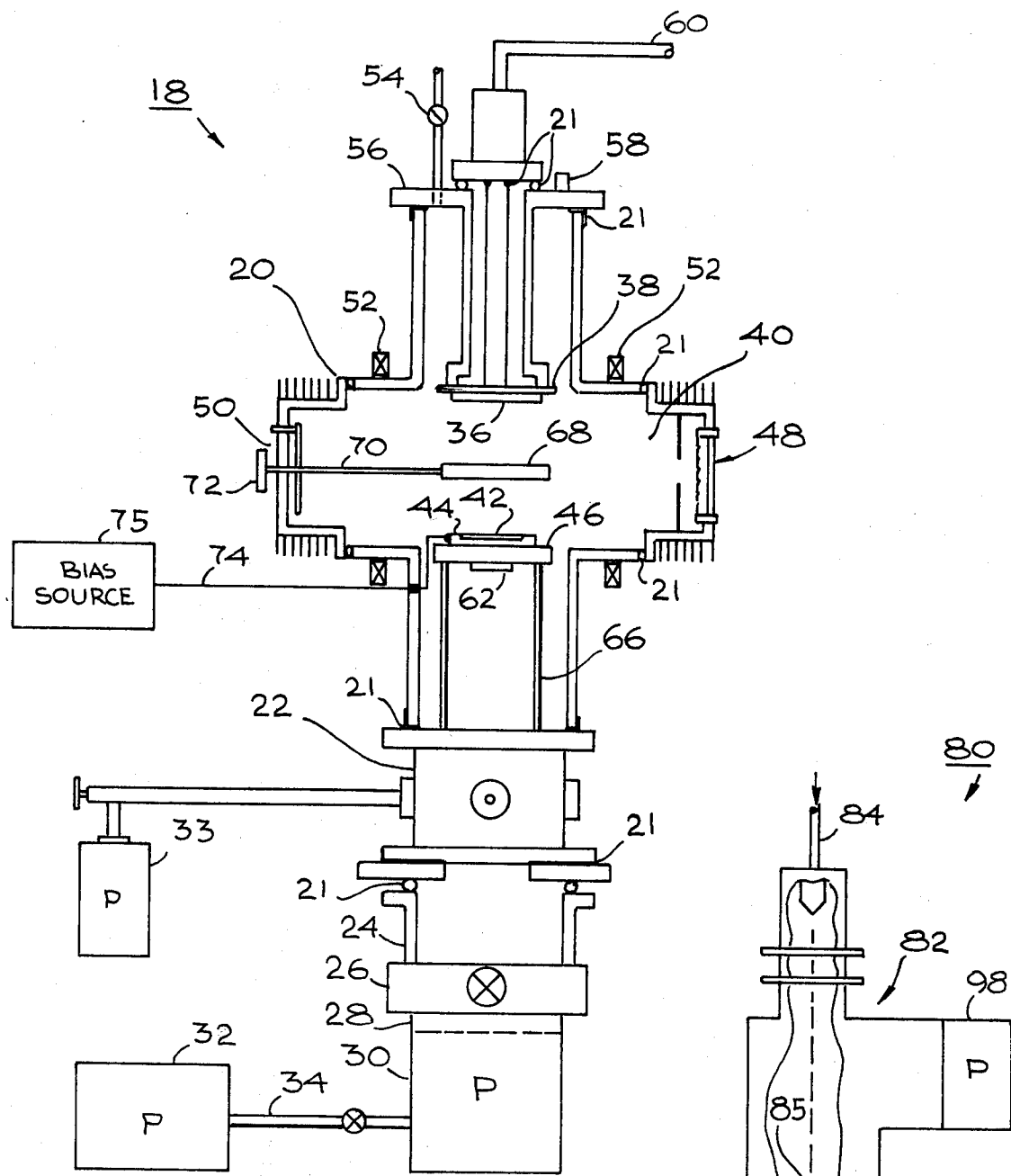
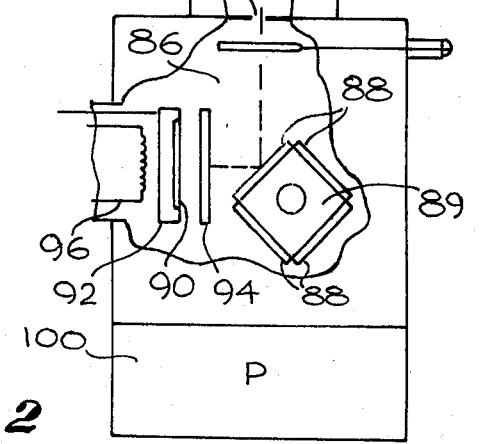
Fig. 1
Fig. 2

THIN FILM PHOTOVOLTAIC DIODES AND METHOD FOR MAKING SAME

BACKGROUND OF THE INVENTION

1. Field of the Invention

The present invention generally relates to photovoltaic diodes and more particularly to the method of preparing high sensitivity photovoltaic diodes which include thin sputtered Art $Pb_{1-x}Sn_xTe$ films.

2. Description of the Prior Art

Present techniques for the fabrication of ternary alloy materials, such as lead-tin-telluride, into sensors for use in photo-detector or -emitter diodes and the like are normally relatively complicated and expensive. Certain of said techniques use bulk crystals of lead-tin-telluride modified by annealing or other methods to form p-n junctions while others of said techniques generate relatively epitaxial film on bulk crystal to form junctions through complicated and expensive procedures. Most such procedures rely upon post-deposition techniques, particularly annealing, to develop reasonable photoelectrical characteristics in the films. Examples of these procedures and the devices formed thereby may be found in "High-Performance 8–14μm $Pb_{1-x}Sn_xTe$ Photodiodes" by Kennedy et al, pp 27ff, PROC. IEEE, January 1975. Diodes of this nature are applicable to the production of photovoltaic infrared detectors, detector arrays and emitters such as tunable lasers and the like employed in sophisticated electro-optical systems with significant and varied usages. Accordingly, it would be highly desirable to be able to provide such diodes in a simple, inexpensive manner utilizing relatively low temperature techniques and to be able to tailor their physical, chemical, electro-optical and electrical properties so as to maximize their utility for specialized applications.

SUMMARY OF THE INVENTION

The foregoing needs have been satisfied by the improved method of making the thin film diodes of the present invention. The method is substantially as set forth in the Abstract above and incorporates one or more unannealed monocrystalline films having the formula $Pb_{1-x}Sn_xTe$ where $x$ may range from 0.0 to about 0.3. Such films are sputter deposited on monocrystalline substrate such as $BaF_2$, $CaF_2$ or the like at low pressure in a selected atmosphere such as argon under controlled conditions such as substrate temperature and film growth rate so that their particular chemical composition can be regulated as well as their carrier type, carrier concentration and Hall mobility for optimum results. A second thin film layer, either of the unannealed monocrystalline type with the formula $Pb_{1-x}Sn_xTe$ where $x =$ about 0–0.3 or in the form of a thin barrier metal is deposited on the first film substrate composite to form the desired diode. Where the second film is a PbSnTe type film, it is sputter deposited under the same general conditions of low pressure, controlled atmosphere and controlled substrate temperature and film growth rate as called for in depositing the first film, but regulated to control its particular x value, as well as its physical, electrical and electro-optical properties. Where the second film is a barrier metal it is sputter deposited or vacuum evaporated on the first $Pb_{1-x}Sn_xTe$ film and, inasmuch as the metal film generally delinates the active area of a Schottky diode sensor, its thickness is for front illuminated application minimized to values of about 100 A or less to facilitate transmission of radiation in the desired spectral response band of the photovoltaic sensor while deposition conditions are controlled to insure the film uniformity and continuity required for an effective Schottky barrier. Fine control over the carrier type concentration and Hall mobility may be made solely through selection of the particular substrate temperature film growth rate combination or also through the application of a substrate bias voltage both in the fabrication of the first and the second $Pb_{1-x}Sn_xTe$ films. Another method of the invention comprises the control of the carrier type, carrier concentration and carrier mobility incorporating minor controlled concentrations of a gaseous additive, either oxygen or nitrogen, in the reaction zone along with the sputtering atmosphere of argon or the like during the sputtering of the first and/or second $Pb_{1-x}Sn_xTe$ film. In accordance with the present method, diodes are provided which can have a photovoltaic response over a wide spectral range with cutoff wavelength of from about 6 – 25μm. The present method is simple and inexpensive and relatively rapid and can be carried out to reliably reproduce the improved diode of the present invention with carefully controlled characteristics.

BRIEF DESCRIPTION OF THE DRAWING

A better understanding of the present invention may be had from a consideration of the following detailed description taken in conjunction with the accompanying drawing, in which:

FIG. 1 is a schematic front elevation of a typical supported discharge sputtering device with which the present method can be carried out;

FIG. 2 is a schematic front elevation, partly broken away to illustrate internal features, of a typical ion beam sputtering device with which the present method can be carried out;

DESCRIPTION OF THE PREFERRED EMBODIMENT

Figure 3:
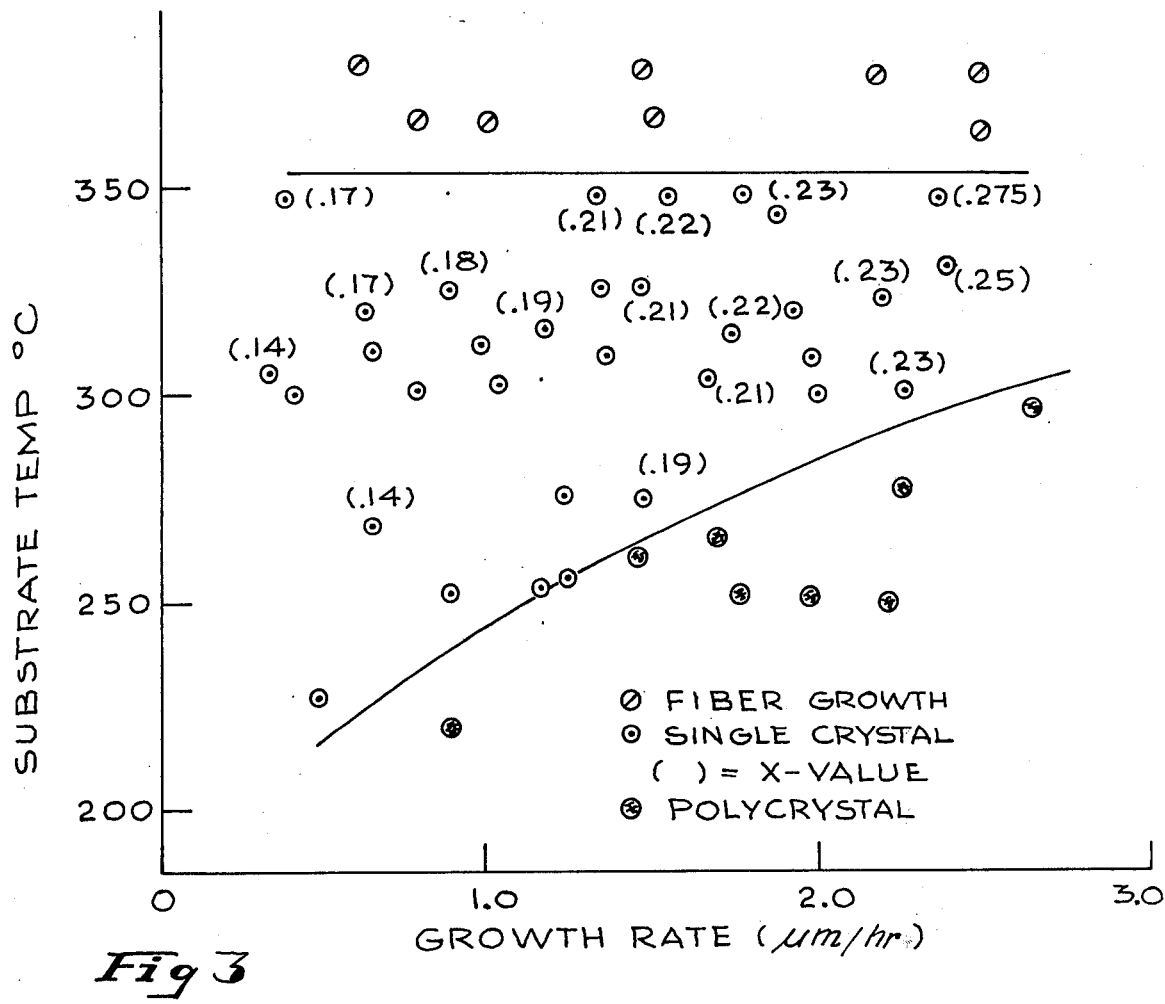
FIG. 3 is a graph plotting substrate temperature against film growth rate to depict the conditions under which monocrystalline films of $Pb_{1-x}Sn_xTe$ are generated in accordance with the present method.

Now referring more particularly to FIG. 1 of the accompanying drawings, a typical device is schematically depicted for carrying out supported discharge sputtering in accordance with one embodiment of the present method. In this regard, a supported discharge sputtering apparatus 18 is shown which has a cruciform-shaped reaction chamber 20 of, for example, about 6 inch diameter cylinders, fabricated of high temperature glass, such as Pyrex type glass, or quartz or the like. It will be understood that chamber 20 and all components therein are maintained contaminant free. Moreover, high purity substrates, targets and gases are introduced, the target is sputter etched in-situ and the substrates thermally etched in-situ, both under high vacuum condition (about $10^{-7}$ torr) prior to initiation of deposition so that in chamber 20 reproducible high purity films are obtained through the use of the present method, more particularly described hereinafter. Thus, chamber 20 is sealed by suitable metal gaskets generally designated 21 and is disposed upon a ported collar 22 which is in turn disposed upon and sealed to a manifold 24 leading from and separated by a gate valve 26 and cryogenic trapping baffle 28 from a turbomolecular or water-cooled diffusion pump 30, a mechanical foreline pump 32, a cryogenic roughing pump 33 and suitable interconnecting lines and valving generally designated 34. The pumps are designed to lower the pressure in chamber 20 to the low $10^{-7}$ torr range. A typical operating background pressure in the chamber in carrying out the method is about $1 \times 10^{-7}$ torr.

A source or target 36 having the formula $Pb_{1-x}Sn_xTe$, where x may vary between about 0 and 0.3, is disposed and held in a horizontal position in a vertically movable holder 38 at the top of the wide horizontal cylinder section 40 in chamber 20, a predetermined but adjustable distance, usually of about 6 cm, directly above and parallel to selected single crystal substrates 42. Substrates 42 are disposed in a horizontal tantalum or other suitable low sputtering metal holder 44 on a receiving surface 46. A tungsten thermionic emitter 48 is located at one end of section 40 and a low voltage anode 50 is located at the opposite end of section 40, the emitter 48 and anode 50 forming with target 36 the triode sputtering mechanism of device 18. Two focusing magnets 52 are disposed at opposite sides of section 40 between emitter 48 and anode 50. In utilizing apparatus 18, a voltage is applied to target 36. This voltage can either be alternating current or direct current. Since the target material 36 is electrically conductive, the direct current mode is preferred and is usually maintained by a direct current supply with a maximum 10 Kv, 50 ma capacity.

Ultra high purity argon gas, or in some instances other suitable gas, for example, neon, after passing through a gas purifier (not shown) enters chamber 20 through a controlled leak line and valve generally designated 54 in the top plate 56 of chamber 20. The gas is added to chamber 20 only after chamber 20 has been evacuated to the previously indicated low pressure (e.g. about $2 \times 10^{-7}$ torr) by means of pump 30, pump 32 and pump 33. The gas thus introduced into chamber 20 through the leak line and valve 54 can be measured through a suitable gauge (not shown) attachable through a connector 58 in top plate 56 of chamber 20. The pressure of the argon gas in chamber 20 generally is in the range of about 0.5–5μm. A diffuse plasma is produced which extends between the thermionic emitter 48 and low voltage anode 50 in chamber 20 and also between target 36 and and substrate 42.

The target 36 is water-cooled, as through a line 60, passing to target holder 38. The temperature of the substrates 42 can be easily controlled within desired limits, through the use of a heater 62 disposed immediately below surface 46 and powered through suitable connections passing through port or collar 22. It will be noted that surface 46 is adjustable vertically by means of a movable support stand 66 on which it rests.

A push-pull shutter 68 is interposed directly between target 36 and the substrates 42 and is adjustable by means of a control rod 70 and vernier type control knob 72 external of chamber 20. Shutter 68 permits a plurality of simultaneous experiments, if desired, to be carried out after a single pumpdown of chamber 20. Thus, for example, substrate holder 44 can be designed to accommodate nine separate substrates 42 arranged in three rows. Shutter 68 can be adjusted to permit exposure of one, two or all rows of the substrates (and thus three, six or all nine substrates) to sputtering deposition at one time and under one to three sets of conditions.

Substrate bias control can be utilized via a line 74 to apply a voltage of a given polarity to metal substrate holder 44. For this purpose, holder 44 is electrically isolated from surface 46 by disposing a plurality of insulators, for example in the form of ceramic standoffs or rings (not shown), between holder 44 and surface 46 and the shutter 68 is grounded to avoid floating potentials.

TARGET PREPARATION

In order to carry out the method of the present invention, it is necessary to prepare a suitable target such as target 36. As previously indicated, the target has a formula $Pb_{1-x}Sn_xTe$ where x may vary between 0.0–0.3. It can be prepared either from the elements lead, tin and tellurium, all of a high degree of purity, for example 6 N purity or the like, or from two compounds in equally purified form, PbTe and SnTe. The preparation of the targets typically involves reacting the elements or the indicated compounds in the desired ratios in a clean quartz reaction vessel sealed under vacuum. Special sealing flasks can be selected for the reactor vessel so as to form the target into the desired shape. Usually, the target-forming reaction is carried out at about 1000° C, for about 6 hours while the reaction vessel is disposed in a vacuum furnace, after which the thus-formed target is cooled at a required slow cooling rate of between approximately 200°-400° C per hour or the like. After the target has cooled, it can be removed from the reaction vessel, and can be shaped, as by lapping, and then cleaned, as by electrochemical etching or the like, well known in the art, in order to provide it with a clean shiny surface. Target 36 can then be attached to holder 38 in part comprising, for example, a high purity copper backplate, as by soldering, utilizing a conductive silver epoxy to provide good electrical and thermal contact but selecting the location of the epoxy so that it will not be exposed to the sputtering plasma and thus cause contamination of the source or deposited film.

SUBSTRATE PREPARATION

In order to carry out the present method it is also necessary to provide the suitable substrate 42 in single crystal form. Any suitable substrate capable of withstanding the operating temperatures encountered by substrate 42 during the sputtering deposition can be used. For example, single crystal rods of calcium fluoride, $CaF_2$, and barium fluoride, $BaF_2$, in either (100) or (111) crystal direction can be used as the starting material. In these cases, the (111) orientated rod material is cleaved in the (111) plane into wafers of desired thickness, typically about 0.050 inches while the (100) orientated material is cut with a diamond saw into wafers of the desired thickness. The (100) surfaces can be checked for orientation by cleaving the crystal slices in two different directions and measuring the angle between the cleavage plane and the cutting plane. The resulting wafers are then lapped or otherwise shaped on a mechanical lapping wheel or the like with successively finer grinding compounds ranging from about $5\mu$ to about $0.5\mu$. They then can be polished on a silk-covered polishing wheel or the like to provide the substrate with a finished shape and polished form.

In accordance with one embodiment of the method of the present invention, the substrate or substrates 42, as the case may be, is or are placed into the tantalum or other low sputter yield metal substrate holder 44 in device 18 and the target 36 is attached in the previously indicated manner to holder 38.

THE DEPOSITION PROCESS

After insertion of the substrate(s) 42 the substrate 42-to-target-36 distance is adjusted, usually to about 6 cm, reaction chamber 20 is evacuated to a background pressure of about $1 \times 10^{-7}$ torr or below, and ultra high purity argon is introduced into chamber 20 through line and valve 54 to a controlled pressure between $0.5\mu m$ Hg and $5\mu m$ Hg as required. The previously described triode system, preferably operating in a direct current mode, is then activated to effect the sputtering deposition of targed material 36 as a single crystal film on substrate 42, with the diffuse argon plasma disposed between emitter 48 and anode 50, target 36 and substrate 42. Target 36 is subjected to a controlled, preferably direct current, voltage to regulate the film growth rate on substrate 42 while the temperature of substrate 42 is maintained as desired by heater 62 to assure the film is single crystal in nature. A substrate bias voltage of about $+30$ to $-30$ volts is applied via line 74 from a bias source 75. The concentration of sputtering gas is constantly controlled by means of a needle valve (not shown) and monitored by vacuum gauges and the like (not shown) to keep it in the desired range so that the method proceeds smoothly until the desired thickness of film is deposited, for example, between about $0.01\mu m$ and about $10.0\mu m$. It will be understood that any suitable film thickness can be obtained. However, thin films of up to about $5\mu m$ are usually desired for sensing systems. The film has the composition $Pb_{1-x}Sn_xTe$ wherein $x$ can range from 0.0 to about 0.3.

Now referring more particularly to FIG. 2 of the accompanying drawings, one type of ion beam sputtering system 80 is schematically depicted with portions broken away to illustrate certain internal components. The particular system 80 depicted includes a duoplasmatron acceleration section 82 of standard design into which high purity argon or other inert gas of desired mass is injected via a line 84 and wherein it is ionized, accelerated through a voltage ranging from about 0 to about 30 Kv. Electro-optical elements (not shown) focus and collimate the ions in a controllable manner. The resulting ion beam then passes through a small orifice into an ultra high vacuum chamber 86 and is directed to impinge on a sputtering target 88, causing sputtering of the target material 88 and deposition of the same on the selected single crystal substrate or substrates 90 disposed in holder 92 of tantalum or the like.

A movable shutter 94 is disposed between target 88 and substrate 90 so that one or more of substrates 90 in holder 92 can be blocked off or simultaneously exposed to the sputtering material 88. it will be noted that target 88 may be set at various angles from the normal to the ion beam axis, for example, at a 45° angle or so that the argon ion beam (shown in dotted outline in FIG. 2) can impinge on target 88 and cause the sputtered target material to strike substrate 90 at desired angles of incidence.

The described sputtering deposition in the ion beam device 80 takes place in an exceptionally low contaminant mode, utilizing a typical background pressure of about $1 \times 10^{-8}$ torr or less, and a working pressure (with the argon beam on the cooled target and the heated substrate) of about $1.5 \times 10^{-7}$ torr. Suitable cooling lines (not shown) run to the target holder 89, which can hold up to 4 targets 88, to controllably cool the target(s) 88. A heater 96, as shown in FIG. 2, is disposed adjacent to substrate holder 92 to control the temperature of substrate 90 within the desired limits. A cryo trapped 6-inch diffusion pump 98 or the like in the accelerator section 82 and a larger cryo trapped 10-inch diffusion pump 100 or the like in the high vacuum chamber 86 can be used to control the pressure and atmosphere in those two sections.

The target 88, its preparation and its composition are similar to target 36 and substrate 90 and its preparation is similar to substrate 42. Thus target 88 has a composition of $Pb_{1-x}Sn_xTe$ where $x$ may range from 0.0 to about 0.3. Substrate 90 can be any suitable single crystal substrate stable at the operating temperature of the present method. For such purposes, the previously described calcium fluoride and barium fluoride single crystals can be used, among other substrates. In addition, substrate voltage bias can be applied, as called for in the operation of system 18.

PREPARATION OF FIRST FILM

In accordance with the method of the present invention, a first film of selected composition of $Pb_{1-x}Sn_xTe$, where $x$ is preselected between about 0 and 0.3, is sputter deposited on a selected single crystal substrate at low pressure in a selected atmosphere in a reaction zone under controlled substrate temperature and film growth rate conditions. In carrying out the deposition, the reaction zone is initially evacuated to a low background pressure, usually to somewhere in the low $10^{-7}$ torr range, with a typical operating pressure of about $2 \times 10^{-7}$ torr. The gas used in the reaction zone is preferably argon, although another inert sputtering gas such as krypton could be utilized. It is present at the indicated pressure.

The sputtering is carried out using a selected PbSnTe target having the composition $Pb_{1-x}Sn_xTe$ where $x$ is between about 0 and 0.3. The substrate is monocrystalline and preferably barium fluoride or calcium fluoride, for example barium fluoride (111) or calcium fluoride (100) or (111), which is maintained during deposition at a controlled substrate temperature of about 200°-350° C. and at a film growth rate of about 0.1-3.0μm/hr, the latter being controlled by the voltage to the target during the sputtering operation. The particular substrate temperature and film growth conditions are initially selected so that the resulting thin film sputter deposited on the substrate will be monocrystalline.

Now referring to FIG. 3 of the drawings, a graph is depicted wherein the range of conditions necessary in order to produce a monocrystalline $Pb_{1-x}Sn_xTe$ film as opposed to a fibrous film or polycrystalline film is depicted. It will be noted that for all temperatures above the horizontal straight line, that is, above about 350° C., fibrous films are produced, while for all conditions below the solid curve shown in the graph, polycrystalline films will be produced. 350° C is apparently the upper limit of epitaxial temperature. A suitable choice of substrate temperature and film growth rate can be made within the range shown between the curved and straight lines in FIG. 3 to provide the resulting film with monocrystalline structure and also a desired $x$ value.

Figure 4:
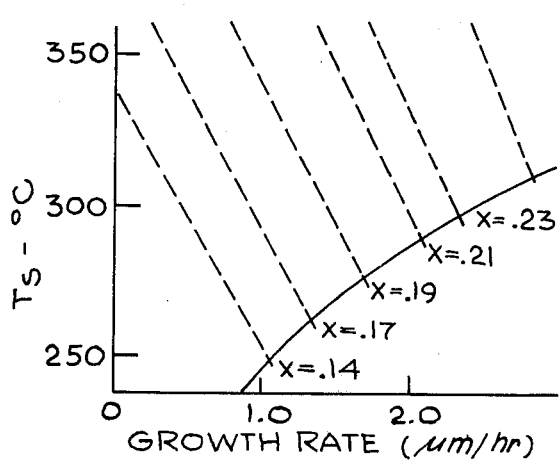
FIG. 4 is a graph plotting substrate temperature against film growth rate utilizing the target of FIG. 3 and showing iso-compositional curves, for various $x$ values.

This control over composition is indicated in FIG. 4 of the accompanying drawings wherein a graph plotting substrate temperature against film growth rate is shown. In the graph of FIG. 4 there are shown a plurality of iso-compositional or x-value curves. Thus, for example, where an x value in the finished thin film to be sputter deposited of for example $x = 0.19$ is desired, any set of conditions which fall on the iso-compositional curve $x = 0.19$ can be applied so long as they are within the region within which monocrystalline films are formed. For example, a film growth rate of about 1.1μm/hr. and a substrate temperature of about 320° C. will produce a film with the desired $x$ value of about 0.19. So also will a film growth rate of about 1.5μm/hr. and a substrate temperature of about 275° C. Further in accordance with the present method, the substrate temperature and film growth rate can also be selected so as to not only control the $x$ value or composition of the film, as shown in FIG. 4, but also the type of the carrier ($p$ or $n$) and the relative carrier concentration and Hall mobility.

Figure 5:
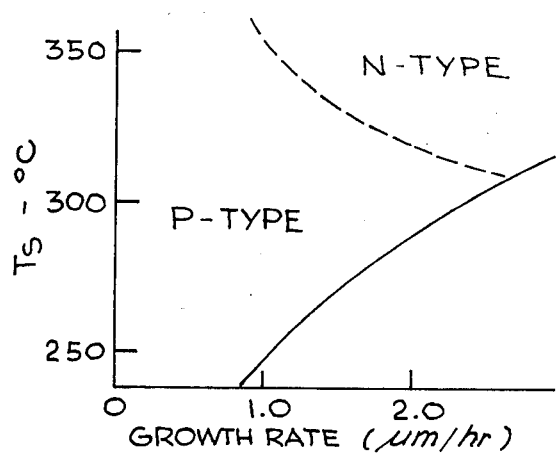
FIG. 5 is a graph plotting substrate temperature against film growth rate, utilizing the target of FIG. 3 and illustrating conditions under which n-type and p-type films are produced.
Figure 6:
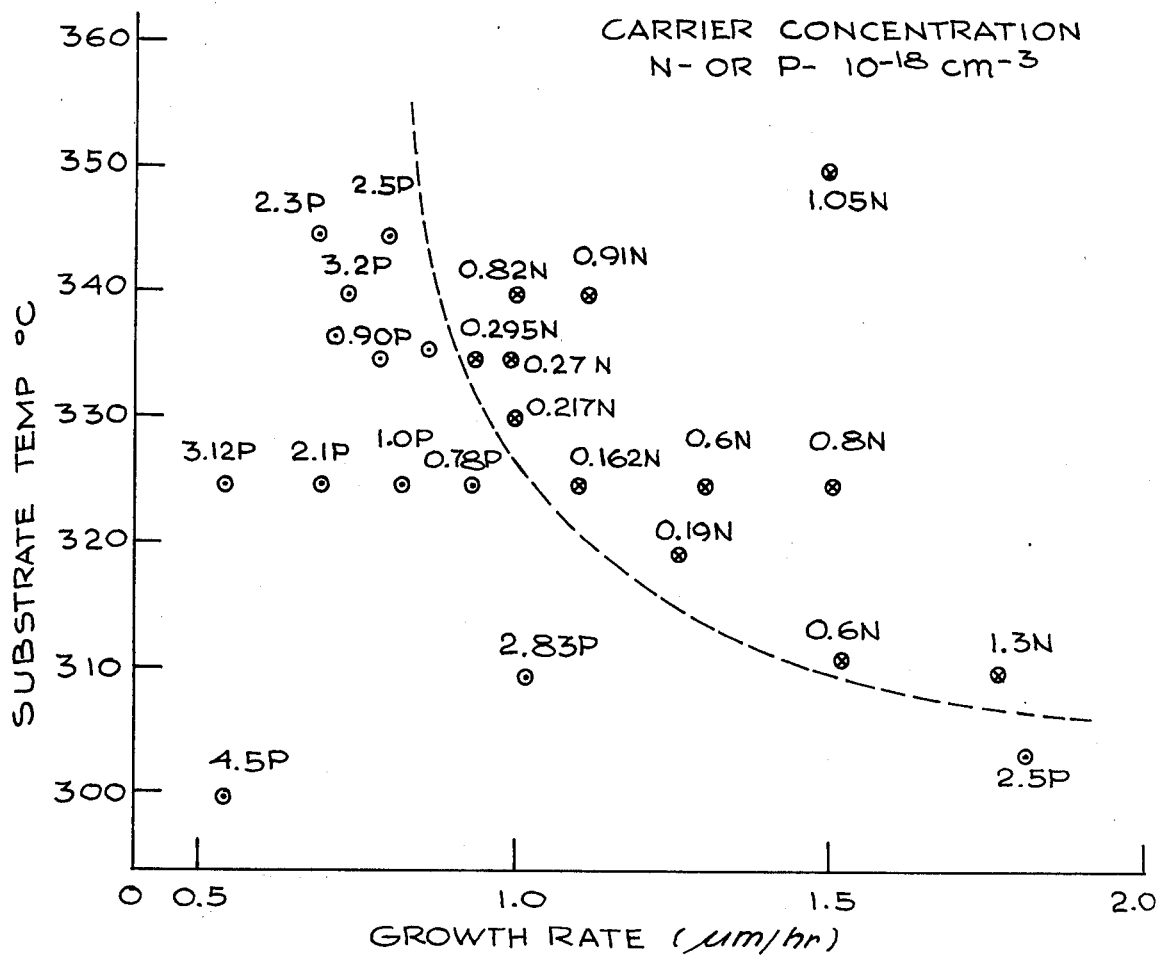
FIG. 6 is a graph plotting substrate temperature against film growth rate, utilizing the target of FIG. 3 and presenting the p-n transition curve and carrier concentration values at locations on either side of the curve.

Now referring to FIG. 5 of the drawings, wherein a graph is shown in which substrate temperature is plotted against film growth rate for the target of FIG. 3, sets of deposition conditions which result in n-type monocrystalline films and in p-type monocrystalline films are depicted. It will be noted from FIG. 6, wherein a graph is shown in which substrate temperature is plotted against film growth rate for the target of FIG. 3, that the carrier concentration is minimal at the p-n transition curve which is shown in broken outline in FIG. 6.

It is desirable to select deposition conditions close to the p-n transition curve in order to reduce the carrier concentration and concomitantly increase the Hall mobility for improved electro-optical properties in the film sputter deposited on the substrate. The carrier type can also be selected in that manner, merely by selecting a set of conditions on one side or the other of the p-n transition curve. Thus the p-n transition curve defines a set of conditions $R_oT_o$ and if the difference between the actual conditions selected (RT) and $R_oT_o$ is kept small, on the order of about 1%, then the resulting p- or n-type film sputter deposited on the substrate will still have a low carrier concentration, usualy less than about $10^{17}$ cm$^{-3}$ and a Hall mobility which is relatively high, for example more than $10^4$cm$^2$/volt-second. Moreover, the composition of the film will be almost, although not exactly, the same as that of the film deposited at $R_oT_o$. The film deposited at $R_oT_o$ is not only monocrystalline but is stoichiometric. That is, it is neither metal rich nor telluride rich (and exhibits the lowest carrier concentration and highest Hall mobility).

It will also be noted that for a given sputtering target composition, i.e., $x$ value, the range of film compositions that can be produced under conditions where RT is equal to $R_oT_o$ is somewhat limited. For example, where an $x$ value of about 0.19 in the sputter deposited film is desired, as previously described in connection with FIG. 4, no set of conditions along the iso-compositional curve $x = 0.19$ can be selected which closely approximates the p-n transition curve of FIGS. 5 and 6, except at the very upper end of the substrate temperature range, i.e., approximately 350° C. and a film growth rate of about 0.8μm/hr. For x values below about 0.19, no set of conditions closely approximates the p-n transition curve if the target of FIG. 3 is used. Accordingly, targets with different composition or x-values are required for different ranges of desired film x-values if such films are to be deposited with a near stoichiometric composition. Typically, a single target can produce stoichiometric films with x-values that are within ±10% of the x-value of the target, unless a technique known as bias control, as more fully set forth hereinafter, is applied, in which event stoichiometric film with any x-value between 0.0 and about 0.3 can be sputter deposited from a single sputtering target.

For such bias control modification of the present method, a selected substrate bias of between about +30 volts and about −30 volts is applied to the substrate in order to alternately control the carrier type, carrier concentration and Hall mobility, without affecting the film composition controlled by the substrate temperature and film growth rate. Thus, for any desired film composition, which is controlled by the combination of substrate temperature and film growth rate selected, one can define a critical substrate bias voltage value $V_o$ which will yield near or exactly stoichiometric film of either n- or p-type, as desired. This independence from composition is the major advantage of the substrate voltage bias sputtering technique over the use of substrate temperature-film growth rate control only, since with a single sputtering target, that is, only one target composition, and utilizing the substrate bias voltage technique, electro-optically high quality films of either carrier type, with low carrier concentration, high Hall mobility and with responsivity over the entire useful spectral range can be fabricated. In accordance with this technique, the actual substrate bias voltage selected is one which is on the order of up to about 0.10 volts away from $V_o$ for the particular RT conditions used, the direction determining whether the film will be p-type or n-type. The film produced at this voltage will have the same composition as that produced using $V_o$ voltage, i.e. either p- or n-type film of identical composition can be formed with near stoichiometric properties, another important advantage of such bias sputtering techniques, particularly as it applies to the deposition of p-n homojunctions.

Figure 7:
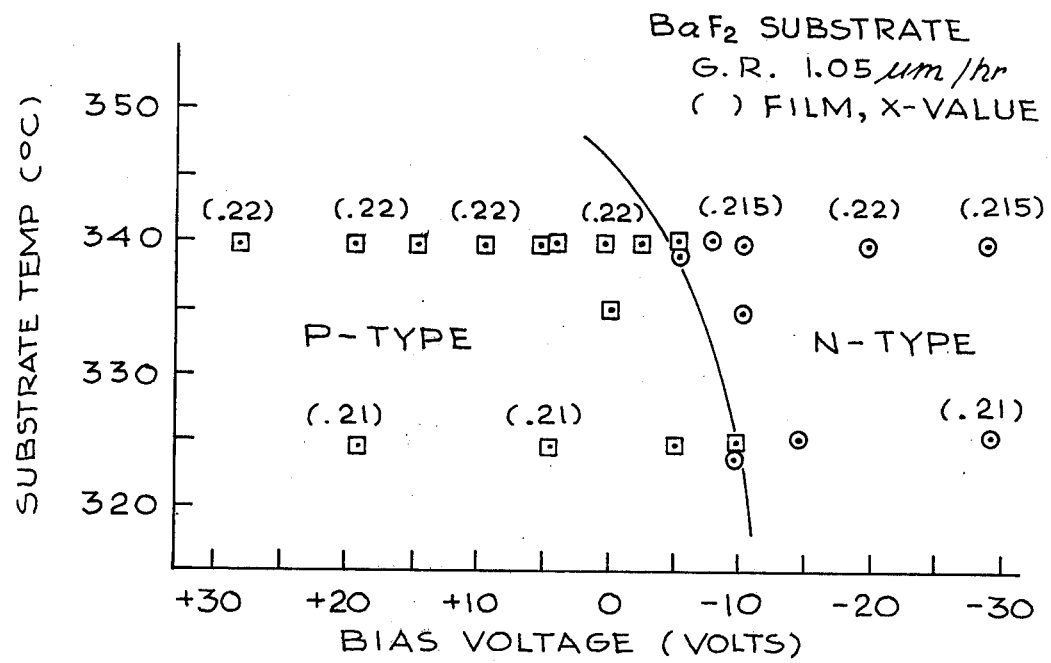
FIG. 7 is a graph plotting substrate temperature against bias voltage for a selected substrate, film growth rate and target and depicting a p-n transition curve relative to said voltage.

Now referring more particularly to FIG. 7 of the accompanying drawings, a graph is depicted wherein substrate temperature is plotted against bias voltage for a substrate of barium fluoride at the film growth rate of 1.05μm/hr. and utilizing a target $Pb_{.78}Sn_{.22}Te$. A switching voltage curve is shown, on the right side of which films of n-type are depicted while those on the left side are of p-type. The $x$ values of the films at the various locations are indicated and demonstrate that regardless of location, the $x$ value of the film does not change. That is, bias voltage does not materially affect the $x$ value of the deposited film.

Figure 8:
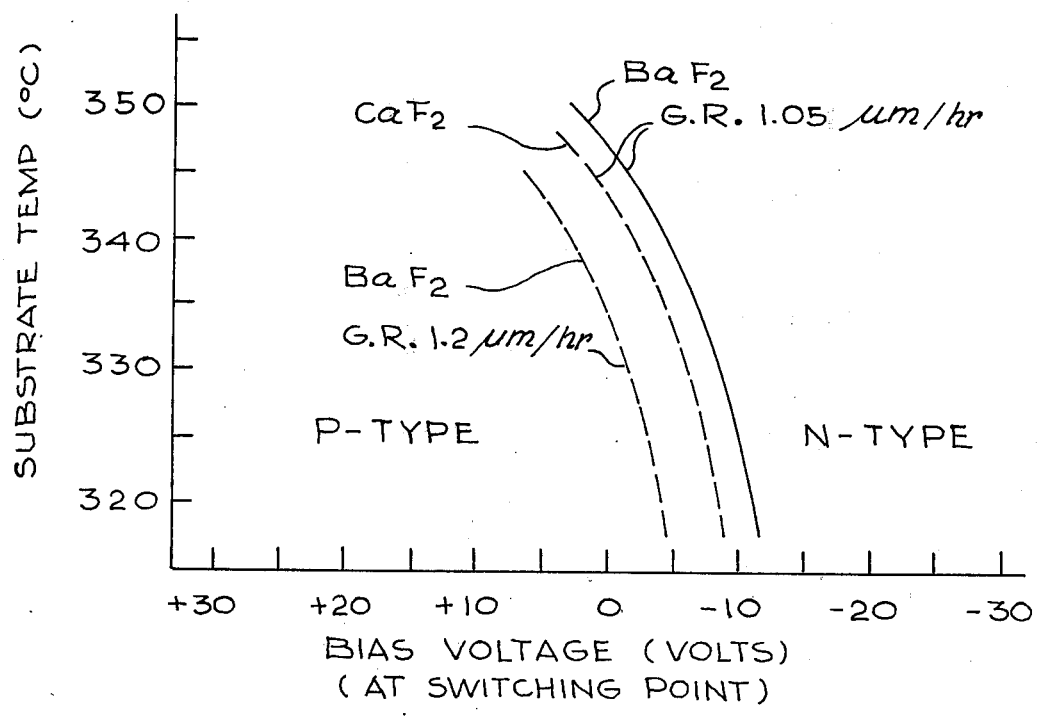
FIG. 8 is a graph plotting substrate temperature against bias voltage at the switching point for two types of substrates, one target and two film growth rates.

In FIG. 8 a graph is shown which plots substrate temperature against bias voltage at the switching point utilizing calcium fluoride and barium fluoride substrates, a target of $Pb_{.78}Sn_{.22}Te$ and two film growth rates, one of 1.05μm/hr. and the other of 1.2μm/hr. FIG. 8 illustrates that for the same growth rate but different substrates, the switching voltage curve is slightly displaced. It is also slightly displaced when the same substrate is used but a different film growth rate is applied.

Figure 9:
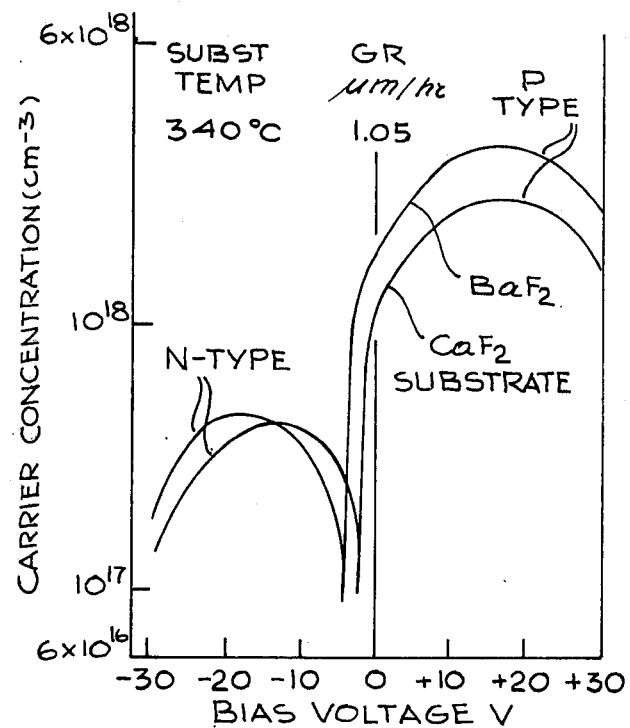
FIG. 9 is a graph plotting carrier concentration against bias voltage for two substrates, a single target and one film growth rate and substrate temperature.

FIG. 9 is a graph plotting carrier concentration against bias voltage and illustrates that for two separate substrates, barium fluoride and calcium fluoride, a single substrate temperature of 340° C. and a single growth rate of 1.05μm/hr., and utilizing a target of $Pb_{.78}Sn_{.22}Te$, minimum carrier concentrations are obtained at the switching point in each instance, that is, at the location where the carrier type switches from $p$ to $n$ or vice versa. This point is, for example in the case of barium fluoride substrate, approximately −4.5 volts while in the case of the calcium fluoride substrate it is approximately −2 volts. All bias voltages more negative than those indicated result in n-type films and all those more positive result in p-type films in each instance, with greater carrier concentrations than at a switching point.

Figure 10:
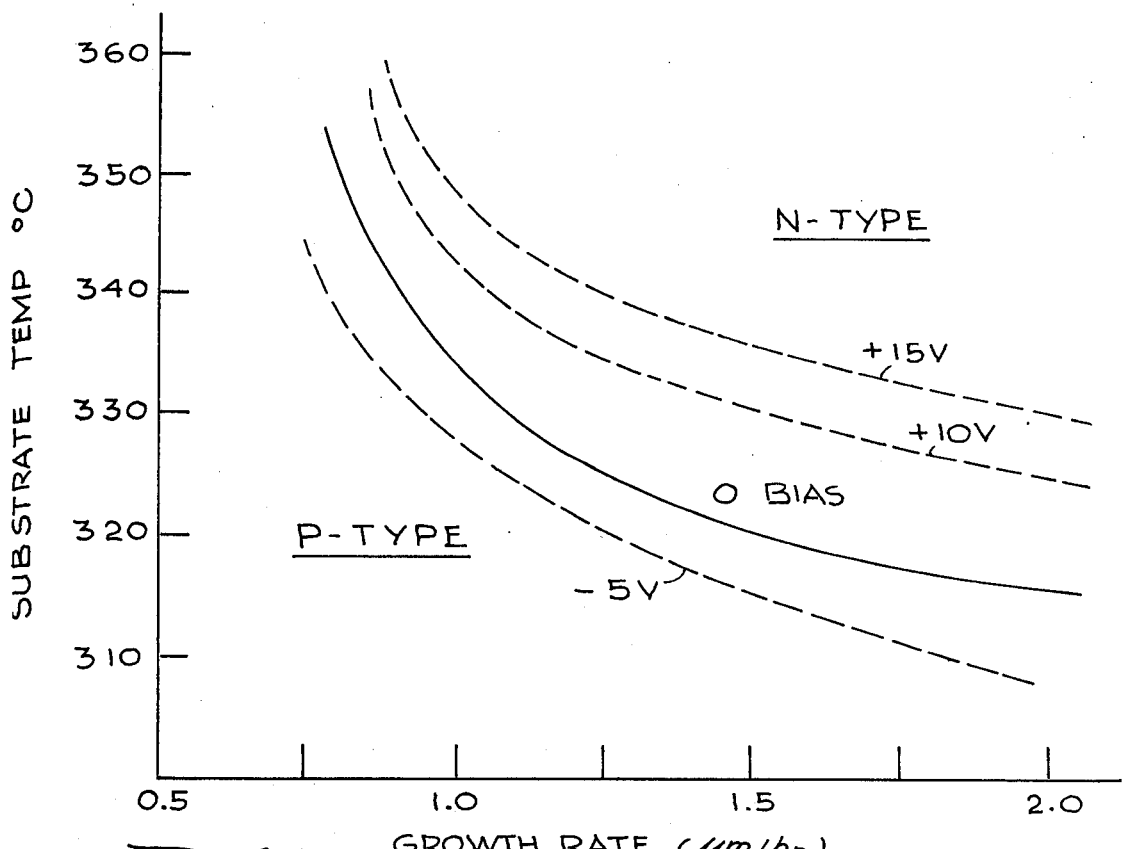
FIG. 10 is a graph plotting substrate temperature against film growth rate for a selected target and depicting p-n transition conditions for various substrate bias voltages.

FIG. 10 is a graph which depicts substrate temperature plotted against film growth for a family of p-n transition curves at various substrate bias voltages. The target is $Pb_{.80}Sn_{.20}Te$ which is 1% tellurium enriched. These critical switching bias voltages for a whole range of deposition conditions of substrate temperature and film growth rate enable one to select the proper bias voltage to accomplish the desired results. The solid curve represents deposition conditions which yield stoichiometric films without the application of a substrate voltage bias while the dotted curves represent deposition conditions which yield stoichiometric films at various indicated bias voltages. Thus, films prepared with higher substrate temperature and film growth rate conditions than those shown for the zero bias situation will be n-type with respect to the carrier type and have higher carrier concentrations. If positive bias voltage is applied, however, to the substrate, the films that would normally be n-type, that is metal rich, will become less so, become stoichiometric or actually become p-type. The reverse is true for the application of negative biases. The result is a shift in the p-n transition curve as indicated by the broken lines in FIG. 10. Accordingly $V_o$ or the voltage at which the switching occurs can be computed for any set of RT conditions and then the actual voltage can be shifted a small increment of up to about 0.1 volts to either provide n- or p-type carriers for the film. The basic mechanism involved in the use of the substrate bias voltage is believed to be preferential rejection or attraction of (ionized) $Pb_{1-x}Sn_xTe$ components at the substrate by positive and negative voltage biases applied to the substrate.

It has been found that a second modification to the present method can be used to control the carrier type, the carrier concentration and the carrier mobility of the sputtered $Pb_{1-x}Sn_xTe$ film. This modification comprises the incorporation in the sputtering gas in the reaction zone during sputtering of minor concentrations of a selected gas additive, either oxygen or nitrogen. While both of the above described basic methods use only substrate temperature and film growth rate to control carrier type, concentration and mobility and the above described bias modification to control carrier type, concentration and mobility by controlling film stoichiometry, the second modification of the present method controls carrier type, concentration and mobility by an apparent free carrier compensation effect caused by trace quantities of two gaseous additives, oxygen or nitrogen, being incorporated in the deposited $Pb_{1-x}Sn_xTe$ film without affecting the crystallinity or composition of the film as preselected by choice of substrate temperature and growth rate.

Figure 11:
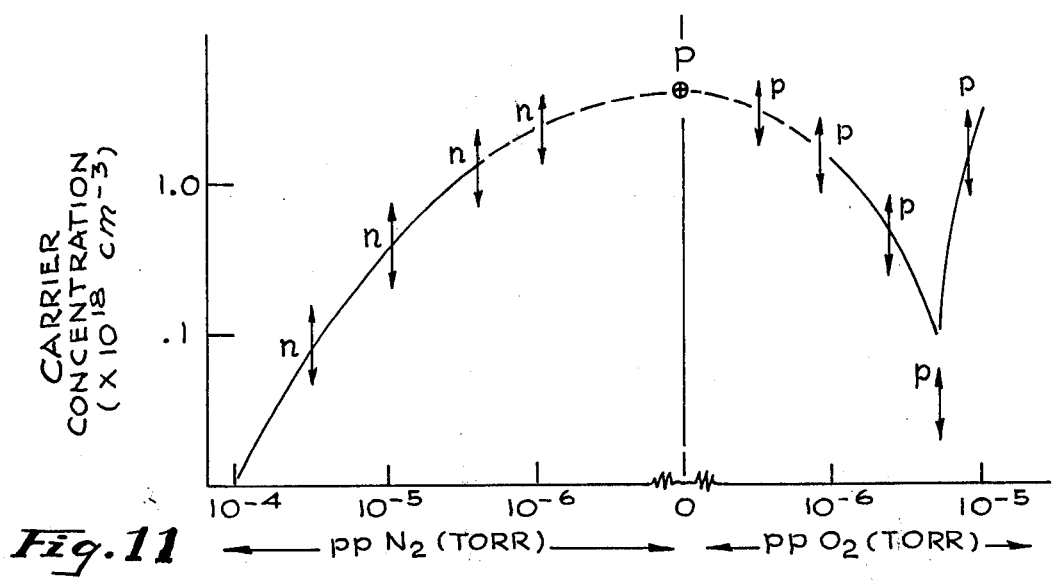
FIG. 11 is a dual graph plotting carrier concentration against dopant gas concentration, the left-hand graph covering the range for nitrogen dopant gas and the right-hand graph covering the range for oxygen dopant gas.

Now referring to FIG. 11 of the drawings, a dual graph is depicted there wherein carrier concentration is plotted on the left-hand graph against nitrogen concentration and on the right-hand graph against oxygen concentration. It will be noted that for zero concentration of dopant gas, the carrier concentration is normally higher than when either dopant gas is present. It will be understood that all gases and other materials in the reaction zone during the sputtering operation must be of high purity. When oxygen is used as a dopant gas it should be present in a partial pressure concentration of up to about $5 \times 10^{-6}$ torr, partial pressures of this gas above this limit resulting in undesirably large increases in p-type carrier concentrations and deterioration of the physical character of the sputtered film. When the oxygen is added the sputtered film will be p-type and the p-type carrier concentration decreases as the oxygen concentration increases to about $5 \times 10^{-6}$ torr, after which any increase in oxygen concentration begins to increase the p-carrier concentration. The particular film composition depicted in FIG. 11 is $Pb_{.79}Sn_{.21}Te$ as deposited at 330° C and a film growth rate of 0.8μm/hr from a target having the composition $Pb_{.75}Sn_{.25}Te$.

When nitrogen of high purity is used as the dopant gas instead of oxygen, it is useful in a partial pressure of up to about $1 \times 10^{-5}$ torr, pressures above that limit causing sputtered film structural deterioration. As shown in the lefthand side of FIG. 11 the use of any nitrogen causes the carrier type to be $n$, and the higher the concentration of nitrogen, the lower the carrier concentration. This modification of the present method is particularly effective in producing $Pb_{1-x}Sn_xTe$ film with very low "effective" carrier concentrations. Values as low as $10^{14} cm^{-3}$ have been measured at 77° K without significantly affecting the carrier mobility.

Thus, the first sputter deposited film in accordance with the present method or its modifications is easily prepared. It is deposited to a preselected thickness on the monocrystalline substrate at a temperature and deposition rate so that both the film itself and the substrate exhibit high structural integrity. The temperature and rate are further selected to give the desired composition or spectral response. Either $R_oT_o$, Vo or partial pressures of $O_2$ or $N_2$ are selected to produce the desired carrier type and to minimize the carrier concentration for highest sensitivity and response speed. All deposition parameters are easily controlled and therefore very amenable to economical detector manufacture. It should be understood that the film need not be annealed after deposition, so that further saving in time and expense is effected by the present method or its modification.

SECOND FILM DEPOSITION

Further, in accordance with the method of the present invention, for the preparation of the desired photovoltaic diodes, it is necessary to deposit a second film. This second film is either a film of $Pb_{1-x}Sn_xTe$ where $x$ may range from 0.0 to about 0.3 or it is a thin metal film barrier, the latter being the case where a Schottky type diode is to be produced.

SECOND FILM $Pb_{1-x}Sn_xTe$

Where the second film is a $Pb_{1-x}Sn_xTe$ film it is deposited by sputtering it on the surface of the first film. This can be accomplished in a single pump-down operation utilizing a single run of device 18 or device 80. The second PbSnTe film is sputter deposited under conditions generally as previously set forth for the first film. The second film is of opposite carrier type to the first film and may either be of the same (or essentially the same) composition as the first film, in which case it forms a homo-junction with the first film, or it can be of a different composition from that of the first film, in which case it forms a hetero-junction with the first film.

An important advantage of the present method is that both the first and second films can be generated in a single pump-down and from a single target. Thus, as the desired thickness of the first film is reached under controlled conditions, the deposition conditions can be suddenly changed so that the second film is then formed which has a carrier type opposite that of the first film and forms a sharp p-n junction.

In the case of a desired homo-junction, the second film is deposited under deposition conditions of substrate temperature and film growth rate which are selected from the same iso-compositional curve as was used for the first film so that the $x$ value of the second film is the same as that of the first film. Thus, for example, now referring again to FIGS. 4 and 5, where the film composition of the first film has an $x$ value of from about 0.21 to about 0.25, RT conditions can be selected for the second film using the same target and the same iso-compositional curve (FIG. 4), but providing a carrier type opposite that of the first film (FIG. 5). Thus, the first film is p-type if the $x$ value is 0.21 and the substrate temperature is about 320° C. and the film growth rate approximately 1.5μm/hr. but the second film is n-type where the film growth rate is held constant but the substrate temperature is increased slightly to approximately 330° C. Thus, the second film is on the opposite side of the p-n transition curve (broken line curve of FIG. 5), but still produces an $x$ value for the film composition which differs insignificantly from the x-value of the p-type.

As noted in the discussion of the first film deposition it is desirable to select RT conditions for the second film which can provide the opposite carrier type but which preferably lie close to $R_oT_o$ so as to have in the second film a minimum carrier concentration and high Hall mobility.

While either the film growth rate or the substrate temperature can be changed when deposition of the second film begins in order to accomplish the desired shift in carrier type while keeping the film composition the same or essentially the same, it is generally advantageous to change the film deposition rate merely by adjusting the voltage to the target rather than changing the substrate temperature, since the film deposition rate can be more rapidly changed and more accurately monitored and controlled. The result is a p-n junction whose interface is sharp relative to those formed by techniques such as high temperature diffusions and the like, and accordingly the present method represents a substantial advance in the art, particularly inasmuch as the sputtering is carried out at relatively low temperatures and with simplified steps and equipment for improved p-n interfaces.

Inasmuch as the second film can be deposited during the same pump-down process as the first film, that is in the same overall operation and in the same apparatus immediately after forming the first film, merely by changing the substrate temperature or film growth rate, the p-n junction therebetween will be void of any interface impurities which are a common drawback or other processes. There will, however, be a slight difference in the x value of the two films which may or may not have an effect on the desired device performance, depending upon whether the configuration is such that carrier generation is to occur in one or both films. However this limitation can also be avoided by the use of a substrate bias voltage as described in connection with the deposition of the first film, since the bias voltage has no effect on film composition.

When substrate bias control is employed in the formation of the first and/or second film where homo-junctions are desired, the parameters RT, that is, substrate temperature and film growth rate, are employed to define those conditions under which a single crystal first film is deposited of the specified composition and are kept constant for the deposition of the second film. The substrate bias is then selected which will produce the opposite carrier type in the second film and still produce conditions yielding nearly or exactly stoichiometric films of low carrier concentration and high mobility in the second film without affecting the composition controlled by the conditions RT. Thus, an actual bias voltage to be applied during the deposition of the second film is selected which is up to about 0.1 volts removed from the value $V_o$ determined for the desired film composition of both films and in the direction opposite that utilized during the deposition of the first film.

Finally if the first and/or second film of the homo-junction is formed in the presence of gaseous additives, oxygen or nitrogen, the second film is sputtered by maintaining the same substrate temperature and film growth rate used during the deposition of the first film. But prior to onset of the deposition of the second film the flow of the gas additive used during the deposition of the first film—say oxygen—is stopped and the residue is pumped out. Then the gas producing the opposite carrier type—say nitrogen—is introduced at the flow rate producing a partial pressure commensurate with the desired low effective carrier concentration in the second film. Then sputter deposition of the second film proceeds to the desired thickness.

The thickness of the individual first and second films depends upon whether front- or back-illuminated sensors are to be prepared. With back illumination, a transparent, for example barium fluoride, substrate is used and the first film has a thickness which is considerably less than the absorption length of the radiation in the specified spectral response band (typically this length being on the order of 1μm in $Pb_{1-x}Sn_xTe$), while the thickness of the second film exceeds the absorption length (but not excessively so as to minimize noise contributions from the detector material), and for example is about 2 to 3μm. For front-illuminated sensors, the reverse holds true and the transparency of the substrate is of no consequence.

Accordingly, in the formation of homo-junctions in accordance with the present method, the second film can be formed utilizing conditions of substrate temperature and film growth rate approaching $R_oT_o$ for the particular $x$ value of the first film but adjusted so as to provide a carrier type opposite that of the first film. Alternatively, exactly the same RT conditions can be selected for the second film as the first film to assure exactly the same $x$ value, but a bias voltage can be applied in order to provide the opposite carrier type and minimal carrier concentration. Moreover, exactly the same RT conditions can be selected for the second film but a change in gas additive from oxygen to nitrogen or vice versa can be used to achieve a change in carrier type and minimal carrier concentration. This electron between these three methods applies whether the first film has been deposited under conditions wherein substrate temperature and film growth rate are the sole controlling factors, whether substrate bias voltage has also been applied or whether gaseous additives were employed during deposition of the first film.

HETERO-JUNCTIONS

In the event that hetero-junctions are to be formed between the two $Pb_{1-x}Sn_xTe$ films, the same techniques as described above for homo-junctions are applied except that, utilizing a single target, it is possible to change the $x$ value of the second film so that it is not the same as that of the first film, merely by adjusting the deposition conditions, that is, the substrate temperature and/or growth rate while still selecting a set of conditions where RT is close to $R_oT_o$ but provides a carrier type opposite that of the first film, or by utilizing substrate bias voltage for such purposes.

In any event no bulk single crystal $Pb_{1-x}Sn_xTe$ or PbTe substrates need be employed to form the p-n layers, as is the case of most other deposition techniques such as liquid phase epitaxy used in preparing hetero-junctions. Moreover, since the first film is a thin film and the second film is also a thin film, the layer thickness of these two films forming the hetero-junction in the present method can be critically controlled for maximum quantum efficiency in the detector configuration. It is also obvious, as in the formation of the homo-junctions by the present method, that both the first and second $Pb_{1-x}Sn_xTe$ films can be sputter deposited on the single crystal substrate in a single overall pump-down operation so as to eliminate possibilities of contamination. It will be understood that since it is no longer, in the case of hetero-junctions, important or critical to maintain substantially the same film composition in the second film as in the first film, the bias voltage technique need not be employed but instead a shift in the R and T need only be carried out to accomplish the desired results. However, the bias voltage control is very advantageous when hetero-junctions are to be formed with widely differing x-values from the same target. As described above, stoichiometric film can only be formed for film x-values that are within about 10% of the target x-value unless bias voltages are applied to the substrate. When bias control is used, the conditions RT of the second film are different from those of the first film so that the $V_o$ value of the second film is different from that of the first film and must be determined and then differentiated from up to about 0.1 volts in the direction necessary to provide the film with a carrier type opposite that of the first film. It will be understood that whenever bias control is used, the RT conditions which are required for each of the films can be selected without a requirement that they lie near the limited critical $R_oT_o$ so long as they lie within the values that assure the proper film composition and single crystal film formation. The bias control adjusts the electro-optical properties to those which are required, that is, carrier type, low carrier concentration and high Hall mobility. The following are specific Examples which illustrate certain further features of the present invention.

EXAMPLE 1

Figure 12:
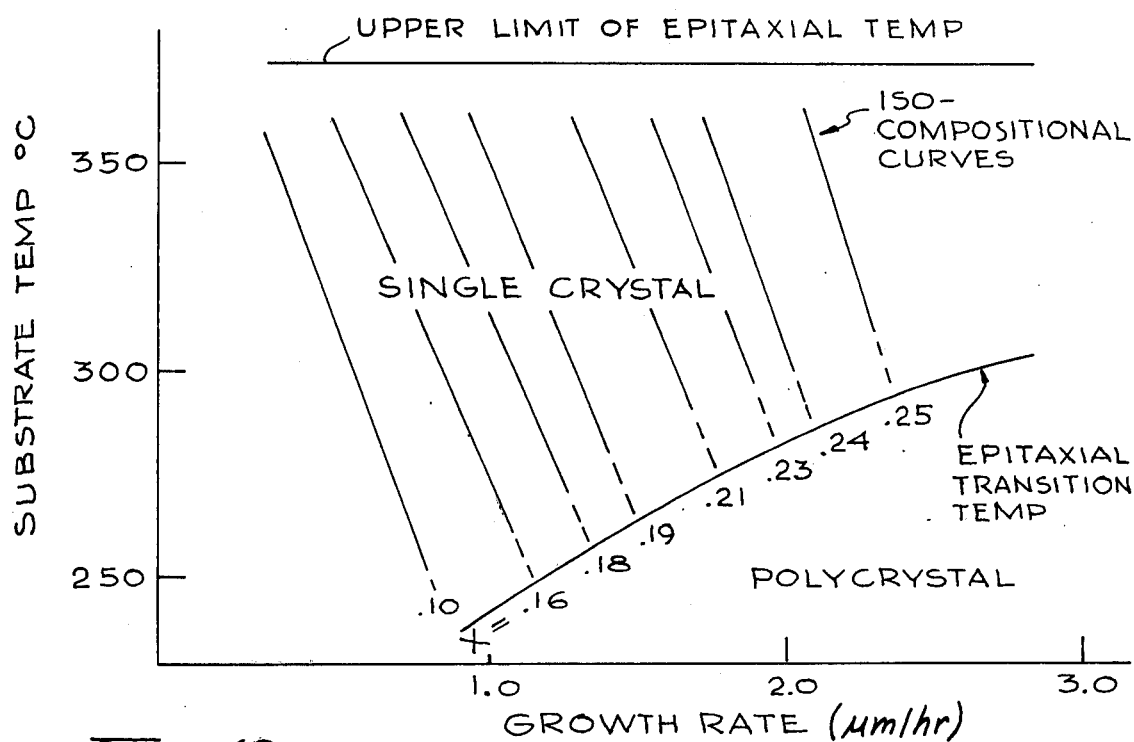
FIG. 12 is a graph plotting substrate temperature against film growth rate, illustrating a family of iso-composition (x-value) curves.
Figure 13:
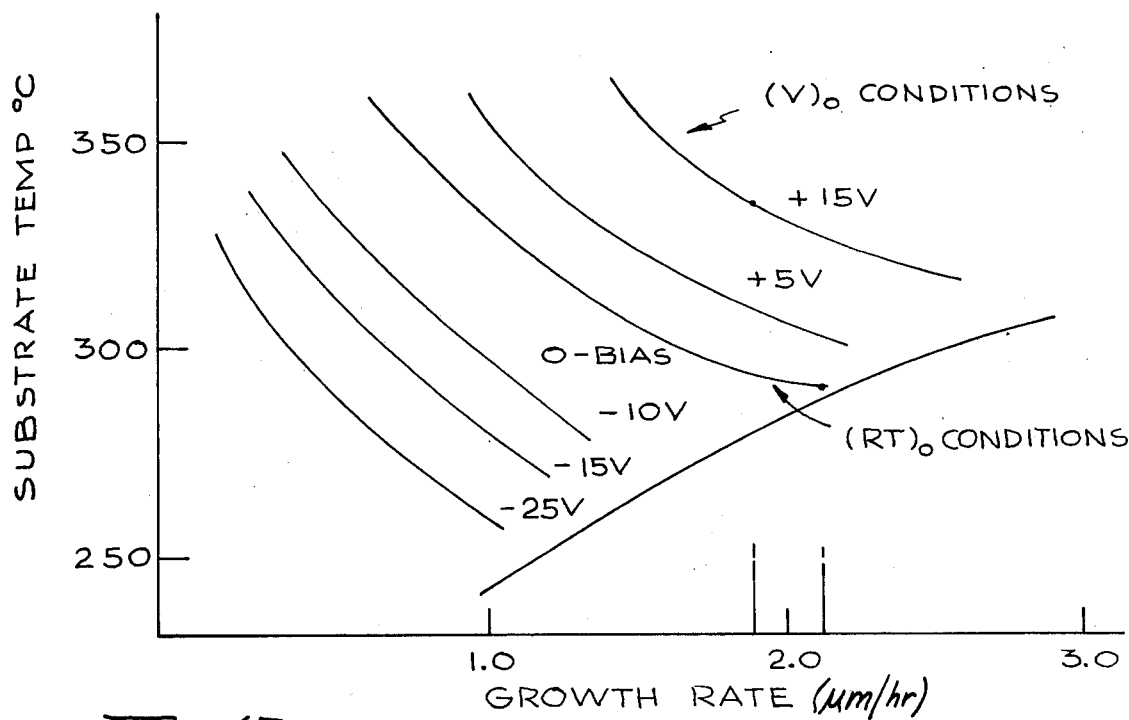
FIG. 13 is a graph plotting substrate temperature against film growth rate, showing p-n transition curves for various substrate voltages.

A homo-junction is desired to be formed without the use of substrate bias control, both films to have the composition $Pb_{.82}Sn_{.18}Te$. Now referring more particularly to FIGS. 12 and 13, FIG. 12 is a graph wherein substrate temperature is plotted against film growth rate and wherein a series of iso-compositional or $x$ value curves for monocrystalline film are set forth generally similar to those of FIG. 4. Although one can select any number of conditions RT between the upper and lower limits within which monocrystalline films are formed and produce films with $x$ values of 0.18, only one of these conditions, namely R = about 0.9μm/hr. and T = about 340° C., falls on the $R_oT_o$ curve, that is the p-n junction curve (FIG. 13). In order to form the desired p-n homo-junction, therefore, a condition $(RT)_1$ slightly below $(RT)_0$ is selected for the first layer and a condition, $(RT)_2$, slightly above $(RT)_0$ for the second layer is selected. For example, $(RT)_1$ may be equal to about 0.89μm/hr. at 340° C. while $(RT)_2$ may be about 0.93μm/hr. at 340° C. The result is a homo-junction with approximately minimal carrier concentration and almost the same film composition of 0.18 in each of the two films. The sputter deposition is first carried out utilizing the $(RT)_1$ condition until the desired thickness of the first film is obtained (about 2–3μm), after which the film growth rate is changed to that called for in $(RT)_2$ to provide the second film of about the same composition but of the opposite carrier type until the desired thickness of the second layer is produced about 1μm). The resulting composition is suitable for front illuminated photovoltaic devices.

EXAMPLE 2

A pair of $Pb_{1-x}Sn_xTe$ films is sputter deposited utilizing apparatus 18 under conditions such that both films so deposited have an $x$ value of about 0.10 (homo-junction). Again referring to FIGS. 12 and 13, it will be noted that a family of conditions can be used to obtain an $x$ value of 0.10. However none of these conditions, as shown in FIG. 13, fall on the $R_oT_o$ curve. Accordingly no stoichiometric or near stoichiometric film of the desired composition can be deposited by the present method without the use of a substrate bias (or change of sputtering target composition). Moreover, only p-type film formations can occur for any set of RT conditions yielding a film composition of $x = 0.10$. However, by applying a substrate voltage bias, almost all of the RT conditions available from the iso-compositional curve of FIG. 12 for $x = 0.10$ can be used for forming monocrystalline films of the $x$ composition at about stoichiometric value. When FIG. 13 is compared with FIG. 12, it will be noted that $V_0$ values for $x = 0.10$ lie in the approximate range of about $-25$ volts to about $-10$ volts. While it is normally desirable to use the highest substrate temperature value and the lowest film growth rate value for best film properties, in the case where the film growth rate is relatively low it may lead to an undesirably long deposition time and accordingly, a higher film growth rate may be desirable. Accordingly, a suitable temperature of, for example, about 320° C. is selected and a film growth rate of about 0.6μm/hr. During the deposition of the first film, a bias voltage of about $-16.9$ volts is applied, $V_o$ being about $-17$ volts at these RT conditions so that a p-type film is provide with about minimal carrier concentration and high Hall mobility. The sputtering deposition is carried out in device 18 until the first film has a thickness of about 2–3μm, after which the same conditions are continued to form the second film on the first film by sputter deposition except that the voltage is changed to about $-17.1$ volts to form an n-type formation. This is continued until the second film has a thickness of about 1μm, after which the process is discontinued. The homo p-n junction formed on the substrate is allowed to cool in increments at about 200°–400° C. per hour to about ambient temperature before the composite is removed from device 18. The result is a satisfactory diode for use in front illuminated infrared sensor devices.

EXAMPLE 3

A thin film $Pb_{1-x}Sn_xTe$ hetero-junction is formed having an n-type film with composition of $x = 0.10$ and a p-type layer of $x = 0.24$, in accordance with the present method. In a first run, p-type $x = 0.24$ film is deposited in apparatus 18 in the manner generally described in the preceding examples utilizing no substrate bias voltage. In this connection, a substrate temperature of about 295° C. and a film growth rate of about 2.15μm/hr. are employed in order to provide the desired p-type film RT conditions which approximate $R_oT_o$, that is, the lower end of the zero bias curve of FIG. 13. In an alternate method, the first film, which is p-type $x = 0.24$, is deposited utilizing substrate bias voltage. First RT values are selected from those falling on the iso-compositional line $x = 0.24$ of FIG. 12. From the family of curves in FIG. 13, a suitable value for $V_o$ that is within the range of about $+10$ volts to about $+30$ volts is selected and the first film is then deposited at a substrate bias voltage of $V = V_o + 0.1$ volts. For example, a substrate temperature of about 340° C. and film growth rate of about 1.9μm/hr. are applied along with a substrate voltage of $+15$ volts so that the resulting film is p-type and close to the 15-volt $R_oT_o$ condition (FIG. 13).

As will be seen from FIGS. 12 and 13 and as previously discussed, there is no stoichiometric or near-stoichiometric film of the second composition $x = 0.10$ that can be deposited from the present target by the present method without substrate voltage bias. Accordingly, substrate voltage bias is supplied to a new set of conditions selected from the iso-compositional line $x = 0.10$ for which the corresponding value of $V_o$ is determined from the curves in FIG. 13, that is, in the range of $-20$ volts to about $-10$ volts. The second film is then deposited with the bias voltage of $V = V_o - 0.1$ Volt so as to be in character and close to the $V_o$ condition.

In order to form desired hetero-junctions with the indicated $x$ values and without the use of a substrate bias, it would be necessary to employ two sputtering targets and consequently two separate deposition steps, generally undesirable because of the loss of time and the possibility of contamination of the first film when the second step is being set up to be run. An exception should be noted, however, for hetero-junctions in which the specific composition difference between the two films is small, for example where the $x$ value of the first film is 0.20 and the $x$ value of the second film is about 0.16. Then it is possible to form hetero-junctions without employing a voltage bias and with employing only one target since in this instance for both compositions, as can be calculated from FIGS. 12 and 13, sets of conditions $(RT)_1 = (RT)_0$ and $(RT)_2 = (RT)_0$ exist. Thus, the present method is extremely efficient in producing homojunctions and hetero-junctions in unannealed sputter deposited $Pb_{1-x}Sn_xTe$ films where x may range from 0.0 to about 0.3.

SECOND FILM—THIN BARRIER METAL FOR SCHOTTKY DIODES

Photovoltaic $Pb_{1-x}Sn_xTe$ Schottky barriers with a desired spectral response of between about 6μm and about 30μm for the long wavelength response cutoff can be fabricated in accordance with the present method. After depositing the first thin film of $Pb_{1-x}Sn_xTe$ on the selected substrate, with or without bias control, instead of depositing a second film of $Pb_{1-x}Sn_xTe$, a suitable thin film barrier metal is deposited either under sputtering conditions or by evaporation, preferably ultra high vacuum evaporation conditions or the like on the composite of the PbSnTe first film and substrate.

The advantage of the present method, as opposed to prior art methods, for the formation of $Pb_{1-x}Sn_xTe$ Schottky barrier diodes is thin film thickness control that can be implemented for highest quantum efficiency and the fact that the present method employs simple, relatively low temperature and highly controllable parameters. Conventional methods generally employ bulk single-crystal $Pb_{1-x}Sn_xTe$ or thick single-crystal $Pb_{1-x}Sn_xTe$ layers as the semiconductive portion of the device.

The advantage of utilizing a thin film Schottky barrier diode of the invention prepared by the present method in contrast to the thin film sputtered homo- or hetero-junction diodes of the invention discussed above is the relative ease, and therefore cost effectiveness, by which, for example, active areas can be defined and delineated during preparation of the Schottky diodes. However, there are certain disadvantages of Schottky diodes, including barrier metal transmission losses, which can militate against, in a given instance, a choice of a Schottky barrier as opposed to a p-n junction device as described above.

For the fabrication of Schottky barriers the semiconductive $Pb_{1-x}Sn_xTe$ first film may be either n- or p-type, if a suitable barrier material exists for either type film. However, the semiconductive $Pb_{1-x}Sn_xTe$ film normally is preferably p-type in order to avoid predictable inversion problems with the small energy gap material. The following description is largely directed to such p-type films, as opposed to n-type films, even though the latter can be made by the processes generally applicable to the p-type films.

The Schottky barrier diode can be used for either front or back illumination applications utilizing the same construction, namely the single crystal substrate with the single crystal $Pb_{1-x}Sn_xTe$ film (where $x =$ about 0–0.3) deposited thereon and the barrier metal deposited on that composite. In the front-illumination instance, the barrier metal must be highly transparent to radiation in the specified response band. Conversely, in the back-illuminated case and infrared transparent substrate, such as $BaF_2$, is utilized. Again, the feasibility of using the same construction for either back or front illumination is an advantage of the thin film Schottky barrier technique of the present invention as opposed to conventional techniques. In either instance the thickness of the $Pb_{1-x}Sn_xTe$ film can be on the order of the absorption length of the radiation of interest, finely controlled for optimized quantum efficiency. Such PbSnTe film is produced in the manner described above in connection with the formation of the first film in the p-n junction devices of the present invention.

The barrier metals used most successfully for Schottky diodes of the present invention with p-type $Pb_{1-x}Sn_xTe$ films are indium and lead, the former being particularly well suited for front-illuminated diodes, since by using very thin films of less than about 50 A, an indium barrier film with infrared transparency (8–14μm) of at least 80% can be reliably deposited.

Since the Schottky diode is basically a surface device, the semiconductor surface thereof must be of exceptional quality. Moreover, the efficiency of the barrier metal can be severely impaired if the metal deposited is not of highest purity and, even at thicknesses on the order of 50 A, does not comprise a continuous deposit. Accordingly, while sputtering can be used to deposit the barrier metal it is preferred to use evaporation for such deposition. In both cases the background pressure must be very low, of the order of $10^{-8}$ torr to assure complete purity. In sputtering deposition of the barrier metal, the working gas pressure is about 0.3–10μm and must be highly purified so that an effective background pressure of $10^{-8}$ torr is retained during sputtering. The energy of the sputtered metal particles must be minimized to alleviate surface damage of the $Pb_{1-x}Sn_xTe$ film surface. However, when ultra high vacuum evaporation is used to deposit the barrier metal, in an environment of $10^{-8}$ torr or less, such problems are eliminated. With either procedure, desired cleanliness of the metal source is achieved by final thermal etch in vacuo after standard purification and etching procedures are utilized prior to installation of the source in the vacuum system. Deposition at ultra high vacuum occurs at ambient temperature to avoid post-deposition modifications of the PbSnTe film properties.

When a transfer of freshly deposited $Pb_{1-x}Sn_xTe$ film from the sputtering apparatus, for example apparatus 18 or 80, to an ultra high vacuum (UHV) metal evaporation system for deposition of the thin barrier metal is required, this must be done in an inert dry environment to minimize surface contamination. Thermal etching below 200° C. at $10^{-8}$ torr and for short times to avoid preferential desorption of the $Pb_{1-x}Sn_xTe$ elements from the surface is required after such transfer into the ultra high vacuum station in order to achieve reliable surface properties.

For back-illuminated diodes, the metal barrier thickness deposited in the UHV environment is not critical and standard thickness control techniques are sufficient, but for front-illuminated diodes the thickness control of such barrier metal is critical and it is achieved by either a very low deposition rate of the order of about 1 A per second, which is controlled with special oscillator monitoring circuits, or by rapid evaporation to completion of a carefully weighed amount of the metal source.

Depending upon size and density requirements, metal or photomasking processes are used to delineate active areas and pads for lead attachments in preparing the Schottky diode for a desired application. For ohmic contacts, platinum is deposited by either evaporation or sputtering on the p-type $Pb_{1-x}Sn_xTe$ film surfaces and on the barrier metal pads deposited for contact purposes.

FINAL FABRICATION

Final fabrication techniques for preparing photovoltaic sensors utilizing the homo-junction, hetero-junction or Schottky barrier junction diodes of the invention disclosed above, are not part of the present invention. They can follow the teachings of the art and can also be specially tailored to meet specific detector requirements. For the $Pb_{1-x}Sn_xTe$ films, platinum or even gold can serve as ohmic contacts for p-type films. Such contacts can be vacuum evaporated at room temperature to a thickness of approximately 1500 A, which is sufficient for attaching leads. Gold wire, for example 0.005 inches thick, can be used satisfactorily for leads. Low noise interconnects between ohmic contacts and gold leads can be prepared with indium or 25/75 InGa solder but other techniques, for example, ultrasonic bonding can be applied.

Single crystal platinum can be deposited on the calcium fluoride or barium fluoride substrate, followed by sputter deposition of the single or double $Pb_{1-x}Sn_xTe$ films. This permits depositing p-layer films directly on the ohmic contact, a desirable feature for front illuminated sensors. If size and density permit, active areas can be defined by masks during sputtering of the two-layer p-n junctions or during evaporation of the Schottky barrier metal. Low sputtering mask materials such as tantalum can be used with good grounding. If deposition is by evaporation of the barrier metal, positive photo resist approaches well-known in the art can be used to define active areas or ohmic contact areas. Negative photo-resists can be used to expose top layers of p-n or n-p junctions if active areas are defined by etched active area mesas. An etchant suitable for etching mesas in the top layers of thin film $Pb_{1-x}Sn_xTe$ junctions is a solution of 2 percent $Br_2$ in 48 percent HBr. The order of fabrication steps will depend on whether front-or back-illuminated detectors or detector arrays are to be fabricated, i.e. whether p-n or n-p junctions are required. If n-p junctions are formed, the ohmic contact to the p-layer can first be deposited as single crystal platinum on a substrate. The junction can then be deposited with the active areas defined during deposition with masks or etched after deposition into the top layer of the junction. This can then be followed by deposition of ohmic contacts on the n-layer active areas or mesas, both of which can be configured such that ohmic contact does not cover the required active area if front-illumination is specified.

Other feasible arrangements are possible. Thus, deposition of both ohmic contacts on the top surface to the p- and n- materials, respectively, is possible. This permits maximum use of common thin film ohmic contact buses to the active areas.

For p- on n-layers, both ohmic contacts are usually deposited on the top surface of the sensor array, unless ohmic contact metal for n-type film is used that can be deposited in single crystal film form, such that epitaxial $Pb_{1-x}1-xxTe$ sputtering on that film is desirable.

In the case of Schottky barrier diodes, ohmic contact to the semiconductor film can be deposited below the $Pb_{1-x}Sn_xTe$ film, if the metal is suitably deposited in single crystal film form, or can be deposited outside the barrier metal contacts on top of the semiconductive $Pb_{1-x}Sn_xTe$ Metallic or other guard ring structures can be deposited around the active areas.

A surface passivation layer and an anti-reflection coating can also be applied to the device, in addition to attachment of the leads. Surface passivation minimizes surface leakage and is essential for high performance devices. Anti-reflection coatings are necessary for such devices due to the high index of refraction of $Pb_{1-x}Sn_xTe$ which causes reflectance of about 50% of the incoming infrared radiation. Preferably, one coating will serve both functions. That is, the passivation layer may be of sufficient thickness to act as a quarter-wavelength antireflection coating. Such coatings are known in the art. Barium fluoride coatings and photoresists suitably permatized are examples of materials useful for such purposes.

Figure 14:
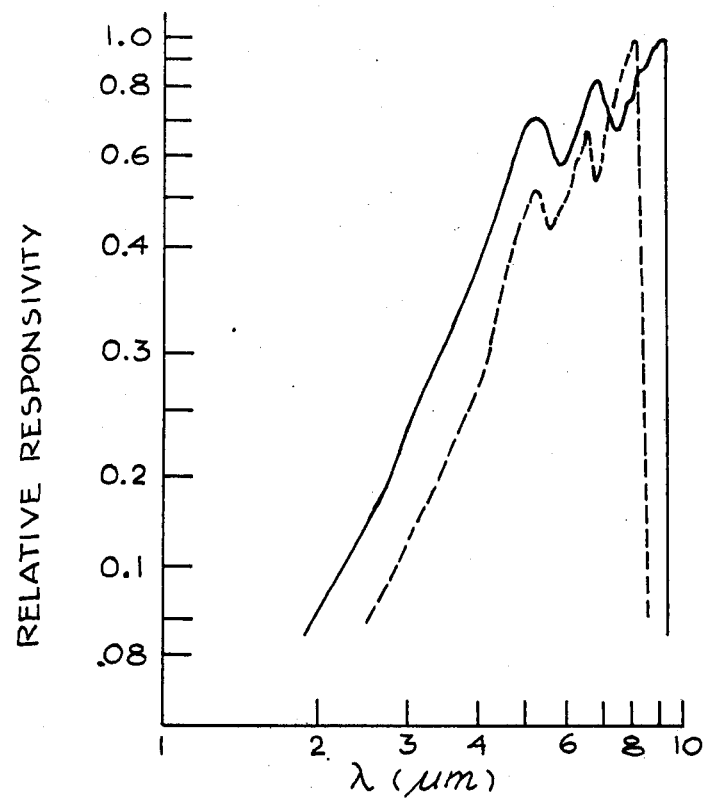
FIG. 14 is a graph plotting relative responsivity against wavelength to illustrate the photovoltaic response of bias sputtered $Pb_{1-x}Sn_xTe$ diodes.
Figure 15:
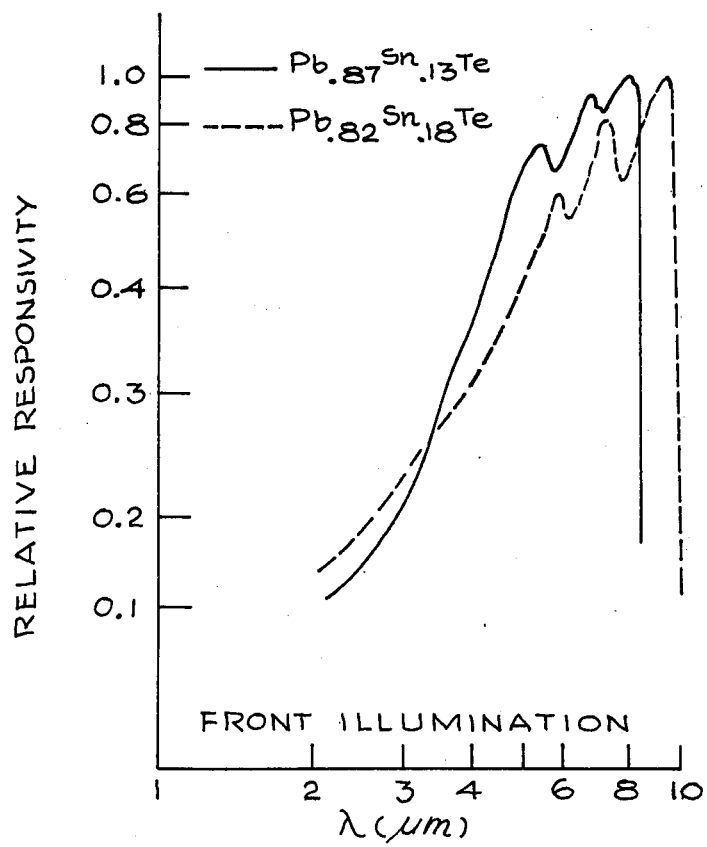
FIG. 15 is a graph plotting relative responsivity against wavelength to illustrate photovoltaic response in transparent Schottky barrier detectors on as-deposited sputtered single crystal thin films of $Pb_{1-x}Sn_xTe$.

FIGS. 14 and 15 illustrate the photovaltaic response of diodes prepared in accordance with the present method. Thus, FIG. 14 illustrates such response of two p-n junctions of specific composition, one a homo-junction, the other a heterojunction, both formed by sputtering utilizing substrate bias, all in accordance with the present method. The cutoff wavelengths conform well to those expected in $Pb_{1-x}Sn_xTe$ films of high quality with the x values of the films formed, about 0.13-0.14. The fluctuations (undulations) noted near the peak response in the curve in the graph of FIG. 14 are due to interference phenomena in the thin films, which can be easily eliminated by film thickness optimization.

FIG. 15 is a graph plotting relative responsivity against wavelength to show photovoltaic response of transparent Schottky barrier detectors utilizing two different $Pb_{1-x}Sn_xTe$ films, one having an x value of 0.13 and the other an x value of 0.18. Both sensors are front-illuminated through the barrier metal which is very thin indium. Again, the x value-cutoff wavelength relationships are well preserved and conform to predicted values. Also, some film thickness-related interference effects in the form of fluctuations appear near the peak responses.

It will be understood that the devices tested, the responsivities of which are shown in FIGS. 14 and 15, do not have anti-reflection coatings and have less than optimized thicknesses relative to highest achievable quantum efficiencies. However, the responsivities of these samples are nevertheless relatively high. Optimized configurations, as opposed to the simple geometries utilized in these examples, are inherently capable of having so-called Blip limited characteristics for highest sensitivity requirements. The critical material properties of the $Pb_{1-x}Sn_xTe$ sputtered films, including low carrier concentration, high mobilities and x values within the desired range, are as good or better than those photovoltaic $Pb_{1-x}Sn_xTe$ devices produced by other techniques for high sensitivity applications. Furthermore, the present method is capable of providing the desired films with superior properties in a more efficient, more rapid and less expensive manner with better parameter control than previous techniques.

Various modifications, changes, alterations and additions in the present method, its steps and parameters and in the improved photovolatic devices prepared by the present method and in the components and parameters thereof can be made in accordance with the foregoing. All such modifications, changes, alterations and additions as are within the scope of the appended claims form part of the present invention.

What is claimed is:

1. An improved method of preparing photovoltaic diodes having thin films $Pb_{1-x}Sn_xTe$, said method comprising:

sputtering from a prereacted $Pb_{1-x}Sn_xTe$ target wherein x is in the range from 0.0 to about 0.3 a single crystal $Pb_{1-x}Sn_xTe$ film of predetermined composition and about 0.1-10µm thickness, wherein x is in the range from 0.0 to about 0.3, on a selected heat resistant single crystal substrate in a reaction zone containing about 0.5-5µm inert gas after first evacuating said reaction zone to at least about $10^{-7}$ torr, said sputtering being effected at a substrate temperature of about 220°-350° C and at a film growth rate of about 0.1-3.0µm/hr., the particular film deposition conditions being selected and controlled to provide said film with a carrier concentration of predetermined type and value, a Hall mobility of selected value, and a spectral response with cutoff wavelengths ranging from about 0.6µm to about 25µm; and therafter depositing on the resulting composite of said film and said single crystal substrate a second film of preselected composition to form a photovoltaic diode.

2. The method of claim 1 wherein said single crystal film of $Pb_{1-1}Sn_xTe$ is deposited at a substrate temperature and film growth rate about those for the critical condition of substrate temperature and film growth rate $R_oT_o$ under which said film exhibits a change in carrier type, so that said resulting film has a preselected carrier type, a carrier concentration of less than about $10^{17}cm^{-3}$, a Hall mobility of more than about $10^4 cm^2/volt-sec$ at 77° K and a composition which is about that of a film deposited from a given target at the condition $R T = R_oT_o$.

3. The method of claim 2 wherein said second film deposited on aid composite is a film of $Pb_{1-x}Sn_xTe$ wherein x is in the range from 0.0 to about 0.3 said second film being deposited directly on said first film under conditions which predetermine the carrier type for said second film, as well as said second film's composition, carrier concentration and Hall mobility, whereby a high quality photovoltaic diode is provided.

4. The method of claim 3 wherein the deposition conditions of said second film are controlled by controlling the substrate temperature and film growth rate in the same manner as for said first film to provide said second film with desired composition, carrier concentration and Hall mobility, said conditions of substrate temperature and film growth rate approximating the critical condition $R_oT_o$ of substrate temperature and film growth rate at which the same target composition switches carrier type for the deposited film.

5. The method of claim 3, wherein said second film is deposited under deposition conditions which include the application of a bias voltage in a range of from about +30 volts to about −30 volts to said substrate during said sputtering, the particular bias voltage applied being selected with respect to the substrate temperature and film growth rate utilized so as to predetermine the carrier type and provide about stoichiometric film composition having desired carrier concentration and Hall mobility.

6. The method of claim 3 wherein said composition of said second film is controlled so as to be about the same composition as that of said first film and the carrier type of said second film is controlled to be opposite that of said first film whereby a homo-junction is formed between said two films.

7. The method of claim 3 wherein the carrier type of said second film is different from the carrier type of said first film and wherein the composition of said second film is different from the composition of said first film, whereby said first and second films form a hetero-junction.

8. The method of claim 1 wherein said first film is deposited under predetermined substrate temperature and film growth rate merely to provide the desired film composition and wherein a substrate bias voltage in a range of between about +30 volts and about −30 volts is utilized, the particular bias voltage being selected with respect to the substrate temperature and film growth rate so as to predetermine the carrier type, the carrier concentration and the Hall mobility of said first film.

9. The method of claim 8 wherein said second film has the composition $Pb_{x-x}Sn_xTe$ wherein $x$ is in the range from 0.0 to about 3.0 and is deposited directly on said first film by said sputtering under conditions which predetermine the composition of said second film, its carrier type and concentration and the Hall mobility thereof to form an improved photovoltaic diode.

10. The method of claim 9 wherein said second film is deposited on said first film at preselected substrate and film growth rate which determine the film composition and provide said second film with preselected carrier type, carrier concentration and Hall mobility, said substrate temperature and film growth rate approximating the critical substrate temperature and film growth rate conditions $R_oT_o$ for said second film at which the carrier type switches whereby an improved photovoltaic diode with controlled characteristics is provided.

11. The method of claim 9 wherein said second film is deposited under substrate temperature and film growth rate conditions merely to control the composition of said film and at a selected substrate bias in the range of from about +30 volts to about −30 volts, said substrate bias voltage being selected with respect to the substrate temperature and film growth rate so as to provide said second film with desired carrier concentration, the desired carrier type and the desired Hall mobility.

12. The method of claim 9 wherein the carrier type of said second film is different from that of said first film but wherein the composition of said second film is controlled to be about that of said first film, whereby said two films form a homo-junction.

13. The method of claim 9 wherein said carrier type of said second film differs from that of said first film, and wherein the composition of said second film differs from that of said first film, whereby said first and second films form a hetero-junction.

14. The method of claim 1 wherein said second film comprises a thin film barrier metal deposited on the resulting composite of said first film and substrate to form a Schottky barrier diode therewith.

15. The method of claim 14 wherein said barrier metal layer is deposited by evaporation under conditions of extremely low pressure of the order of about $10^{-8}$ torr background pressure and selected purity of said metal source for said barrier metal deposition and wherein said barrier metal deposition is effected at a temperature low enough to effect a continuous film formation and avoid degradation of the surface of the first film.

16. The method of claim 15 wherein said first film is p-type and said barrier metal comprises indium.

17. The method of claim 1 wherein said atmosphere comprises argon.

18. The method of claim 17 wherein said atmosphere includes a minor concentration of gaseous addition selected from oxygen and nitrogen to provide the selected carrier type and to decrease the effective carrier concentration of at least one of said first and second films to form a homo- or hetero-junction therewith.

19. An improved photovoltaic diode, said diode comprising:

a heat resistant monocrystalline substrate, a first unannealed monocrystalline film of $Pb_{1-x}Sn_xTe$, wherein $x$ is in the range from 0.0 to about 0.3, sputtered on said substrate to form a composite therewith, said first film having selected carrier concentration and Hall mobility and desired carrier type, a spectral response cutoff ranging from about 6μm to about 25μm and a second film disposed on said composite and selected from the group consisting of a thin, up to about 50Å, barrier metal and a crystalline unannealed sputtered film of $Pb_{1-x}Sn_xTe$ wherein $x$ is in the range from 0.0 to about 0.3, wherein the carrier type is opposite that of said first film, wherein said second film has a selected carrier concentration, and Hall mobility and a thickness not in excess of about 5μm.

20. The improved photovoltaic diode of claim 19 wherein said second film has a composition $Pb_{1-x}Sn_xTe$ wherein $x$ is in the range from 0.0 to about 0.3.

21. The improved photovoltaic diode of claim 20 wherein said second film has a composition and thickness the same as said first film, whereby said second film is deposited directly on said first film and forms a homo-junction therewith.

22. The improved photovoltaic diode of claim 20 wherein said second film is deposited directly on said first film and wherein said second film has a composition different from said first film, whereby said two films form a hetero-junction.

23. The improved photovoltaic diode of claim 19 wherein said second film comprises a thin barrier film and wherein said diode comprises a Schottky barrier diode.

24. The improved photovoltaic Schottky barrier diode of claim 23 wherein said first film is of the p-carrier type and where said barrier metal comprises indium.

* * * * *